(12) United States Patent
Kistner et al.

(10) Patent No.: US 6,835,994 B2
(45) Date of Patent: Dec. 28, 2004

(54) POWER SEMICONDUCTOR MODULE

(75) Inventors: Michael Kistner, Bamberg (DE);
Reinhold Dillig, Memmelsdorf (DE);
Sebastian Raith, Erlangen (DE);
Manfred Loddenkoetter, Ibbenbueren (DE); Reinhold Bayerer, Warstein (DE)

(73) Assignee: EUPEC Europaeische Gesellschaft fuer Leistungshalbleiter mbH & Co. KG, Warstein-Belecke (DE)

( * ) Notice: Subject to any disclaimer, the term of this patent is extended or adjusted under 35 U.S.C. 154(b) by 0 days.

(21) Appl. No.: 10/298,396

(22) Filed: Nov. 18, 2002

(65) Prior Publication Data

US 2003/0085423 A1 May 8, 2003

Related U.S. Application Data

(63) Continuation of application No. PCT/DE01/01870, filed on May 17, 2001.

(30) Foreign Application Priority Data

May 18, 2000 (DE) .......................................... 100 24 516

(51) Int. Cl.[7] ...................... H01L 29/00; H01L 23/053; H05K 1/18
(52) U.S. Cl. ...................... 257/501; 257/500; 257/701; 257/702; 257/703; 361/763; 361/765; 73/431; 73/493
(58) Field of Search .................................. 257/500, 501, 257/607, 701–703, 723–725, 762–764, 728, 706–707, 760, 765; 361/760, 763, 765; 73/493, 756, 431

(56) References Cited

U.S. PATENT DOCUMENTS

| 3,721,746 A | | 3/1973 | Knappenberger |
| 4,600,968 A | | 7/1986 | Sekiya et al. |
| 5,536,972 A | * | 7/1996 | Kato ........................... 257/706 |
| 5,761,039 A | | 6/1998 | Bruees et al. |
| 6,053,049 A | | 4/2000 | Chen et al. |
| 6,344,973 B1 | * | 2/2002 | Feustel et al. .............. 361/760 |

FOREIGN PATENT DOCUMENTS

| DE | 40 36 426 A1 | 5/1991 |
| DE | 90 07 439.4 | 1/1992 |
| DE | 199 20 505 A1 | 11/2000 |
| EP | 0 547 877 A2 | 6/1993 |
| EP | 0 633 609 A2 | 1/1995 |
| JP | 61 039 561 | 2/1986 |

* cited by examiner

Primary Examiner—Donghee Kang

(57) ABSTRACT

A power semiconductor module contains a power component and a sensor component. The power component is disposed on a first substrate. The sensor component is electrically and/or mechanically insulated from the power component by being disposed on an individual, separate second substrate. In this manner, disturbances of the sensor system section caused by the power section and its operation can be avoided particularly reliably.

16 Claims, 3 Drawing Sheets

POWER SEMICONDUCTOR MODULE

CROSS-REFERENCE TO RELATED APPLICATION

This application is a continuation of copending International Application No. PCT/DE01/01870, filed May 17, 2001, which designated the United States and was not published in English.

BACKGROUND OF THE INVENTION

Field of the Invention

The invention relates to a power semiconductor module.

In power semiconductor modules, electronic power components are connected to one another in a power section. Such electronic components include, for example, power transistors, insulated gate bipolar transistors (IGBTs), power diodes, etc.

In addition to power components in a power section, power semiconductor modules increasingly also require a sensor system section, which has sensors for example for temperature monitoring, under voltage monitoring, over-voltage monitoring, etc.

However, it has been found to be problematic to integrate a sensor system section with a power section in a power semiconductor module. Both during normal operation of the power semiconductor module and in the event of a fault, such high voltages and/or currents can occur in the power section that the electronics of the sensor system section are damaged, as is true particularly in the event of a fault. Alternatively, the accuracy of the measurement signal is adversely affected by crosstalk and, in fact, this can even occur during normal operation.

Furthermore, in the event of thermal overloading, this can lead to failure, possibly with an explosion of components, in which case, because the sensor system section is very close to the failure location this can lead to mechanical damage to the sensor system.

In order now to allow these difficulties to be overcome reliably the sensor system section in the prior art is accommodated separately from the power section outside the power semiconductor module. In other words, the power semiconductor module contains only the power section while the sensor system section is disposed outside of the power section.

Although this makes it possible to overcome the problems described above directly, because the electronics of the sensor system section are protected against high voltages, the measurement signal is not adversely affected by crosstalk owing to the separation between the power section and the sensor system section, and mechanical damage in the event of a failure is likewise improbable.

Such a separate configuration of a power section and a sensor system section has the disadvantages of an increased space requirement, and a relatively large distance between the components of the power section and the components of the sensor system section that evaluates the measurement signals. This detracts from the detection of measured values, for example when measuring temperatures. In other words, for accurate measured value detection, the power section and the sensor system section should be disposed as close to one another as possible, and there should not be any long signal paths between them.

Another possible way to separate the power section from the sensor system section of the power semiconductor module is to pass the signal transmission via externally disposed optocouplers, so that the sensor system section is DC-isolated from the power section.

The disadvantages of an externally disposed sensor system section also, in the end, occur with the optocouplers. The transmission path between the power section and the sensor system section is still relatively long, and the additional complexity for the optocoupler should not be underestimated.

SUMMARY OF THE INVENTION

It is accordingly an object of the invention to provide a power semiconductor module that overcomes the above-mentioned disadvantages of the prior art devices of this general type, in which a power section and a sensor system section are integrated, and in which disturbances of the sensor system section caused by the power section and its operation can be avoided particularly reliably.

With the foregoing and other objects in view there is provided, in accordance with the invention, a power semiconductor module. The power semiconductor module contains a first substrate, a power section disposed on the first substrate, a separate second substrate disposed alongside or on the first substrate, and a sensor system section disposed on the second substrate resulting in a double electrical and/or mechanical isolation formed between the power section and the sensor system section.

The solution according to the invention relates to the sensor system section being provided with an additional, separate second substrate. The additional substrate is disposed alongside and/or on the substrate of the power section, so that a double electrical and/or mechanical isolation is provided between the power section and the sensor system section.

The power semiconductor module according to the invention thus provides an additional, separate substrate for the sensor system section. The additional, separate substrate for the sensor system section can be soldered alongside and/or to the substrate of the power section, or can be connected to it in some other way. The components of the sensor system section thus have double electrical and/or mechanical isolation from the power section. In this way, even in the event of a fault, such as a fracture of the substrate of the power section, full isolation of the sensor system section is ensured by the additional, separate substrate. The mechanical isolation of the sensor system section from the power section provides mechanical protection for the sensor system section in the event of a failure against module components becoming detached, for example in the event of an explosion, so that, even in the event of a failure, this ensures that measured values are recorded and passed on by the sensor system section.

The additional, separate substrate that is provided in the power semiconductor module according to the invention is also, for example, superior to silicone encapsulation, which is occasionally used in existing power semiconductor modules for isolation of the sensor system section. The same applies to the use of inner plastic housings around such a sensor system section instead of silicone encapsulation. In any case, neither silicone encapsulation nor an inner plastic housing offer reliable electrical isolation and shielding of the sensor system section from the power section in the event of a fault.

However, this is not true of the power semiconductor module according to the invention. As has already been explained above, the sensor system section in the power semiconductor module is provided with the additional, separate substrate, which is preferably composed of metal and if required may have a separating wall, or which even forms a metal housing around the sensor system section. The additional, separate substrate can thus, for example, be in the form of a metal sheet, which is soldered onto the power section substrate, which forms a base plate. The metal sheet then forms a grounded separating wall between the sensor system section and the power section that not only reduces crosstalk during normal operation but also effectively prevents short circuits in the event of a fault. Alternatively, the second substrate can be formed from a ceramic or composed as a DCB.

The power semiconductor module according to the invention ensures that the sensor system section and the power section are very close to one another, thus ensuring that measured values can be detected accurately while at the same time providing better insulation for reliable electrical isolation, even in the event of a fault.

The essential feature of the present invention is thus the configuration of the additional, separate second substrate for the sensor system section. In which case the substrate, if it is required, may also include at least one, in particular conductive, separating wall between the sensor system section and the power section in order to provide further mechanical and/or electrical isolation.

If the substrate (and if required, may have a separating wall or a housing element) is composed of metal, then the metal is preferably grounded. The separating wall and or the housing element can alternatively be formed of ceramic, plastic or metel.

In a further preferred embodiment of the power semiconductor module according to the invention, the power semiconductor module has an edge area and/or a housing area. In this case, provision is then also made for the housing element of the sensor system section of the power semiconductor module to be at least partially integrated with the edge area and/or housing area, and/or to be formed essentially integrally with it.

This can be achieved in a particularly advantageous manner by providing an insulating frame as the housing element, which insulating frame has plug-in elements, and by the capability to hold and/or fix the insulating frame in the edge area and/or housing area by plugging in the plug-in elements into recesses which are provided there. These precautions allow the housing element of the sensor system section to be fitted particularly easily in a given edge or housing of the power semiconductor module, so that it is even possible to consider retrofitting of already existing power semiconductor modules.

A further simplification of the power semiconductor module according to the invention is obtained if the housing element of the sensor system section is formed integrally with the edge area and/or housing area, in particular as a molded-on insulated frame. In this case as well, it is also possible to include the construction of the housing element and/or of the insulating frame in the normal production process for the power semiconductor module, for example by the construction of the housing or of the edge of the power semiconductor module being extended by the construction of the housing element in at simple manner, possibly using an injection-molding method.

Retrospective fitting of a molded-on insulating frame in already existing power semiconductor modules or in their edge and/or housing areas is likewise conceivable.

Other features which are considered as characteristic for the invention are set forth in the appended claims.

Although the invention is illustrated and described herein as embodied in a power semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
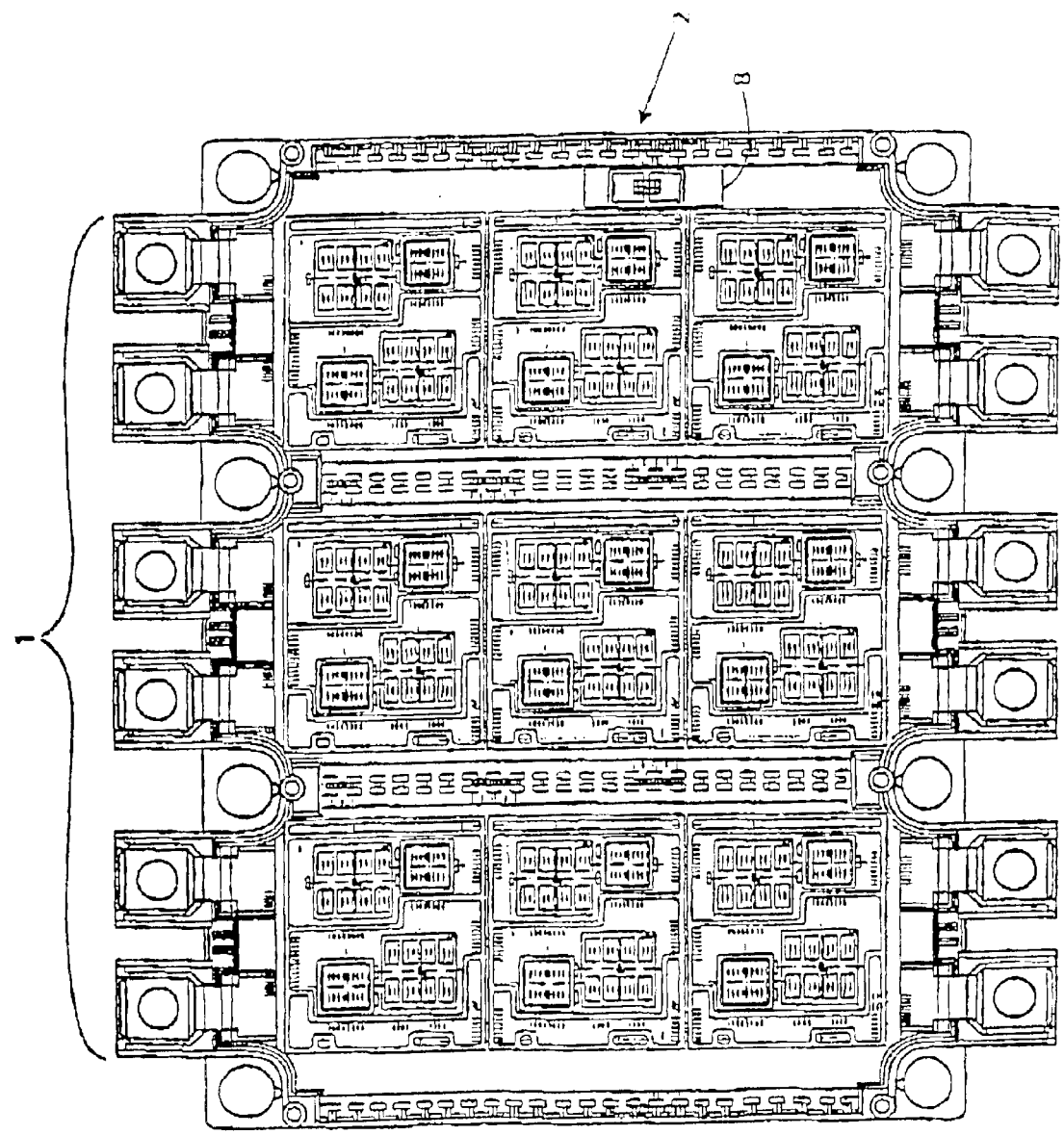
FIG. 1 is a diagrammatic, plan view of a power semiconductor module according to a first exemplary embodiment of the invention.

Referring now to the figures of the drawing in detail and first, particularly, to FIG. 1 thereof, there is shown a power semiconductor module containing a large number of power transistors, IGBTs, etc. The semiconductor module has a power section 1 and a sensor system section 2. The sensor system section 2 has, for example, a temperature sensor, which is used for monitoring a temperature of the power section 1.

The power section 1 and the sensor system section 2 are provided on a substrate 3, for example a copper plate, a DCB substrate or the like.

Figure 2:
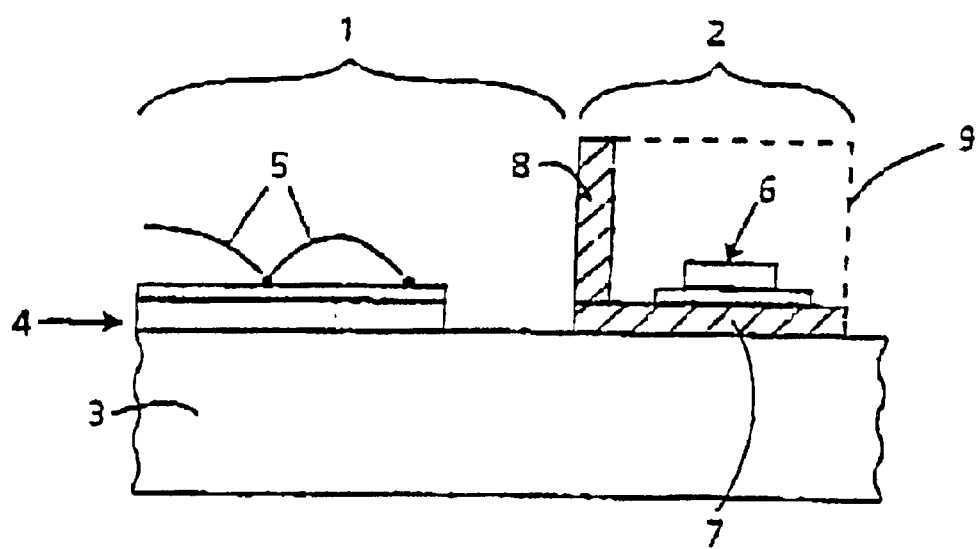
FIG. 2 is a partial section view through the power semiconductor module shown in FIG. 1.

As can be seen from FIGS. 1 and 2, the power section 1 contains a number of components 4, which are connected to one another by wires 5, conductor tracks, etc.

The sensor system section 2 has a sensor 6, which is electrically isolated from the power section 1 via an additional, separate substrate 7, which is connected to the substrate 3. The substrate 7 may be a DCB 20 substrate, may thus at least partially be composed of metal, and may additionally still have a grounded isolating plate 8 for additional electrical and/or mechanical isolation.

Instead of the grounded isolating plate 8, the temperature sensor 6 may also be surrounded by a housing 9 that is, in particular, metallic.

The separate, additional substrate 7 does not necessarily need to be made of metal. It can also be produced from a different, suitable material, which ensures adequate shielding from the power section 1 and/or offers mechanical protection. Examples of this include ceramic substrates, for example DCB substrates (copper-ceramic-copper sandwich), plastics or the like.

The additional, separate substrate 7 in any case ensures double electrical and/or mechanical isolation of the sensor system section 2 from the power section 1, in which case the isolation may also include shielding against electrical fields etc.

If required, the additional, separate substrate 7 may also, instead of the separating wall 8, have the housing element 9 that encloses the sensor 6 so that the latter (if the housing element 9 is composed of metal) is completely shielded against influences from electrical fields. The housing element 9 also provides particularly advantageous mechanical isolation or separation.

Figure 3:
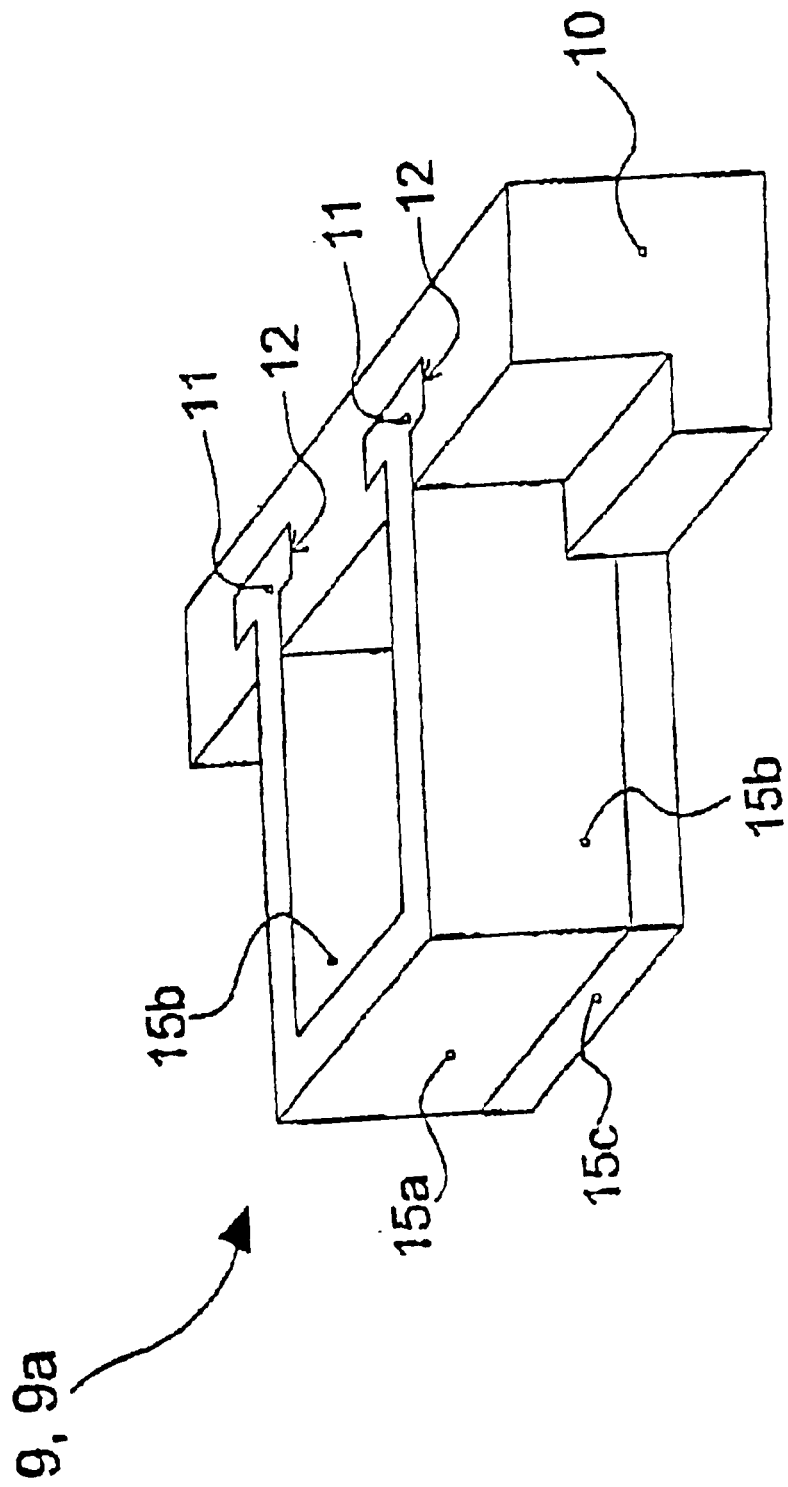
FIG. 3 is a perspective, plan view of a housing element in the form of an insulating frame.

FIG. 3 shows a perspective plan view of the housing element 9. The housing element 9 is in the form of an insulating frame 9a and has a front wall 15a, side walls 15b and a bottom area 15c. The insulating frame 9a created in this way furthermore has plug-in elements 11 in the area of the rearward edges of the side walls 15b, which plug-in elements 15 are configured such that they can be inserted in an interlocking manner into recesses 12 in the edge or housing area 10 of the power semiconductor module, in order to hold and to fix the insulating frame in the edge/housing area 10.

The insulating frame shown in FIG. 3 provides particularly good electrical and mechanical isolation for the sensor system section 2, which is accommodated in the insulating frame 9a, against electrical loads and against mechanical attacks.

We claim:

1. A power semiconductor module, comprising:
   a first substrate;
   a power section disposed on said first substrate;
   a separate second substrate disposed one of alongside and on said first substrate; and
   a sensor system section disposed on said second substrate resulting in at least one of a double electrical and mechanical isolation formed between said power section and said sensor system section;
   said second substrate functioning as a housing element for said sensor system section, said housing element being grounded.

2. The power semiconductor module according to claim 1, wherein said second substrate is at least partially formed of metal.

3. The power semiconductor module according to claim 1, wherein said second substrate is at least partially composed of ceramic.

4. The power semiconductor module according to claim 1, wherein said second substrate is composed of DCB.

5. The power semiconductor module according to claim 1, wherein said second substrate has at least one separating wall.

6. The power semiconductor module according to claim 5, wherein said separating wall is composed of a material selected from the group consisting of ceramic, plastic and metal.

7. The power semiconductor module according to claim 1, wherein said housing element is composed of a material selected from the group consisting of ceramic, plastic and metal.

8. The power semiconductor module according to claim 7, further comprising a housing area, and said housing element is at least partially integrated with said housing area.

9. The power semiconductor module according to claim 8, wherein said housing element is formed integrally with said housing area.

10. The power semiconductor module according to claim 7, further comprising an edge area, and said housing element is at least partially integrated with said edge area.

11. The power semiconductor module according to claim 10, wherein said housing element is formed integrally with said edge area.

12. A power semiconductor module, comprising:
    a first substrate;
    a power section disposed on said first substrate;
    a separate second substrate disposed one of alongside and on said first substrate;
    a sensor system section disposed on said second substrate resulting in at least one of a double electrical and mechanical isolation formed between said power section and said sensor a stem section, said second substrate functioning as a housing element for said sensor system section, said housing element being composed of a material selected from the group consisting of ceramic, plastic and metal; and
    a housing area, said housing element being at least partially integrated with said housing area;
    said housing element being an insulating frame having plug-in elements;
    said housing area having recesses formed therein, and said insulating frame being one of held and fixed in said housing area by plugging said plug-in elements into said recesses.

13. A power semiconductor module, comprising:
    a first substrate;
    a power section disposed on said first substrate;
    a separate second substrate disposed one of alongside and on said first substrate;
    a sensor system section disposed on said second substrate resulting in at least one of a double electrical and mechanical isolation formed between said power section and said sensor system section, said second substrate functioning as a housing element for said sensor system section, said housing element being composed of a material selected from the group consisting of ceramic, plastic and metal; and
    a housing area, said housing element being formed integrally with said housing area;
    said housing element being a molded-on insulating frame molded on said housing area.

14. A power semiconductor module, comprising:
    a first substrate;
    a power section disposed on said first substrate;
    a separate second substrate disposed one of alongside and on said first substrate;
    a sensor system section disposed on said second substrate resulting in at least one of a double electrical and mechanical isolation formed between said power section and said sensor system section, said second substrate functioning as a housing element for said sensor system section, said housing element being composed of a material selected from the group consisting of ceramic, plastic and metal; and
    an edge area, said housing element being at least partially integrated with said edge area;
    said housing element being an insulating frame having plug-in elements; and
    said edge area having recesses formed therein, and said insulating frame being one of held and fixed in said edge area by plugging said plug-in elements into said recesses.

15. A power semiconductor module, comprising:
    a first substrate;
    a power section disposed on said first substrate;

a separate second substrate disposed one of alongside and on said first substrate;

a sensor system section disposed on said second substrate resulting in at least one of a double electrical and mechanical isolation formed between said power section and said sensor system section, said second substrate functioning as a housing element for said sensor system section, said housing element being composed of a material selected from the group consisting of ceramic, plastic and metal; and an edge area, said housing element being formed integrally with said edge area;

said housing element being a molded-on insulating frame molded on said edge area.

16. A power semiconductor module, comprising:

a first substrate;

a power section disposed on said first substrate;

a separate second substrate disposed one of alongside and on said first substrate, said second substrate having at least one separating wall, with said separating wall being electrically grounded; and a sensor system section disposed on said second substrate resulting in at least one of a double electrical and mechanical isolation formed between said power section and said sensor system section.

* * * * *